United States Patent [19]

Nishizawa

[11] 4,354,140
[45] Oct. 12, 1982

[54] LIGHT-EMITTING SEMICONDUCTOR

[75] Inventor: Jun-ichi Nishizawa, Sendai, Japan

[73] Assignee: Zaidan Hojin Handotai Kenkyu Shinkokai, Sendai, Japan

[21] Appl. No.: 154,057

[22] Filed: May 28, 1980

[30] Foreign Application Priority Data

May 28, 1979 [JP] Japan .................................. 54-66679
May 28, 1979 [JP] Japan .................................. 54-66680

[51] Int. Cl.³ ...................................... H01L 33/00
[52] U.S. Cl. ........................................ 313/499; 357/17
[58] Field of Search .......................................... 313/499

[56] References Cited

U.S. PATENT DOCUMENTS

| 3,267,294 | 8/1966 | Dumke et al. | 313/499 X |
| 3,537,029 | 10/1970 | Kressel et al. | 313/499 X |
| 3,600,240 | 8/1971 | Rupprecht et al. | 313/499 X |
| 3,617,820 | 11/1971 | Herzog | 313/499 X |
| 3,634,872 | 1/1972 | Umeda | 313/499 X |
| 3,677,836 | 7/1972 | Lorenz | 357/16 X |
| 4,049,994 | 9/1977 | Ladany | 313/499 |

FOREIGN PATENT DOCUMENTS

| 2702935 | 1/1977 | Fed. Rep. of Germany | 357/17 |
| 49-99266 | 9/1974 | Japan . | |
| 49-99268 | 9/1974 | Japan . | |
| 49-106481 | 10/1974 | Japan . | |
| 50-114386 | 9/1975 | Japan . | |
| 51-32532 | 9/1976 | Japan . | |
| 50-105537 | 4/1977 | Japan | 357/17 |
| 54-53978 | 4/1979 | Japan . | |

OTHER PUBLICATIONS

Beppu et al., "High-Efficiency GaP Green LED's by Zinc Diffusion into an n-LPE Layer," IEEE Transactions on Electron Devices, vol. ED-24, No. 7, Jul. 1977, pp. 951-955.

Primary Examiner—Robert Segal
Attorney, Agent, or Firm—Cushman, Darby & Cushman

[57] ABSTRACT

On a semiconductor substrate of one conductivity type are disposed successively an active semiconductor layer of said one conductivity type, another active semiconductor layer of the other conductivity type and of a low impurity concentration, and a barrier semiconductor layer of the other conductivity type and a high impurity concentration. This another active semiconductor layer constitutes a main radiative region and light emitting in this radiative region is extracted at the side of the barrier layer.

The barrier layer is arranged to form a potential barrier of an appropriate height for those minority carriers in that another active semiconductor layer, and reflects the minority carriers back into the active semiconductor layer.

Non-radiative recombination is thereby reduced, and radiative recombination is promoted. Thus, the light-emitting efficiency is improved.

22 Claims, 12 Drawing Figures

LIGHT-EMITTING SEMICONDUCTOR

BACKGROUND OF THE INVENTION (a) Field of the Invention

The present invention relates to a light-emitting semiconductor device, and more particularly to a light-emitting semiconductor device having a plurality of compound semiconductor layers or compound mixed crystal semiconductor layers formed on a semiconductor substrate for radiating incoherent light.

(b) Description of the Prior Art

Light-emitting semiconductor devices are usually formed with compound semiconductors or compound mixed crystal semiconductors, which impose various limitations on the manufacturing processes, and, hence on the structure, of the light-emitting semiconductor device to be produced.

In light-emitting diodes, substrates are usually formed with compound semiconductors and used to serve as an ohmic region for leading-out an electrode. A diode structure formed with a p type semiconductor region and an n type semiconductor region is formed on a substrate.

Description will hereunder be made of some typical examples of conventional light-emitting diodes.

A GaAsP light-emitting diode is formed with an n+ type GaAs substrate, an n type GaAsP epitaxial layer formed on the n+ type GaAs substrate, and a p type region which is selectively diffused in the n type GaAsP layer. The p type diffusion region has a typical impurity concentration of about $1 \times 10^{18}$ cm$^{-3}$ and is formed to be thin, being below several micrometers, to avoid excessive absorption of emitting and progating light in this p type region. The output light is extracted from that side of this p type region located opposite to the substrate.

A GaP light-emitting diode is formed with an n+ type GaP substrate, an n type epitaxial GaP layer and a p type epitaxial GaP layer, these latter two epitaxial layers being successively grown on said n+ type GaP substrate. The p type layer has a typical impurity concentration of about $1 \times 10^{18}$ cm$^{-3}$. The output light is extracted at the side of this p type layer.

A GaAs light-emitting diode has a similar structure as that of the above-mentioned GaP light-emitting diode. The p type surface layer has a typical impurity concentration of about $2 \times 10^{18}$ cm$^{-3}$. The output light is extracted from either at the side of the p type surface layer or at the side of the n+ type substrate (in this latter case, the substrate is partially etched away at sites where the output light is to be extracted).

A GaAlAs light-emitting diode is formed with a p+ type GaAs substrate, a p type $Ga_{1-x}Al_xAs$ epitaxial layer formed on the GaAs substrate, and an n type $Ga_{1-y}Al_yAs$ epitaxial layer formed on the p type epitaxial layer. The compositions (mixing ratios) x and y are selected to satisfy the condition x<y so as to effectively extract the output light at the side of the n type epitaxial layer. The n type epitaxial layer has a typical impurity concentration of about $1 \times 10^{17}$ cm$^{-3}$.

In these prior art examples, the substantial part, or the diode structure, of the light-emitting diode is formed with a single n type region and a single p type region which constitute a pn junction therebetween, and it is formed on a substrate. Such structure is relatively easy to manufacture because of its simplicity. The light-emitting efficiency of such LED, however, is inherently limited by this simple structure of the light-emitting diode.

There are also some proposals for improving the light-emitting efficiency of such LEDs by the adoption of an inner structure in the region located between the pn junction and the substrate.

When the radiative semiconductor region has a composition different from that of the substrate, a buffer layer for absorbing lattice mismatch and/or lattice strain may be formed on the substrate.

Iwamoto et al proposed, in Japanese Laying-open Preliminary Patent Publication No. Sho 54-53978 (laid-open on Apr. 27, 1979), a GaP:N green-light emitting diode in which an n type GaP layer and a p type GaP layer are formed successively on an n type GaP substrate. The donor concentration of the n type layer is changed stepwise to form an n+ type layer on the substrate, and to form an n− type layer on this n+ type layer. Nitrogen is heavily doped solely in the n− type region adjacent the p type surface layer. Iwamoto et al refer to IEEE Trans. on Electron Devices, ED-24, No. 7, pp 951–955 (Beppu et al) in stating that the doped nitrogen atom concentration and the donor concentration are mutually related. They teach, on the basis of this article, that the light-emitting efficiency can be improved by decreasing the donor concentration and by increasing the nitrogen atom concentration at sites located near the pn junction. The intermediate n+ type layer between the radiative n− type layer and the substrate is recommended as a kind of buffer layer. This technique, however, only applies to the nitrogen-doped GaP light-emitting diode.

Dumke et al, in U.S. Pat. No. 3,267,294, proposes a liquid nitrogen coded switching device (i.e. operated at the liquid nitrogen temperature), using a deep level impurity provided by Mn or other transition metals. However, the deep level of a transition metal is not suitable for use as the light-emission center of the diode, because it generally has predominant function of serving as a non-radiation center at room temperature. Moreover, even if an emission of light occurs, the light tends to have a prolonged wavelength. Thus, as compared with the emission of light across those bands with which a shallow impurity is associated, the visibility is particularly poor.

Also, Umeda, in U.S. Pat. No. 3,634,872 proposes the provision of a potential to repel carriers injected across the PN junction from the junction by increasing the impurity distribution on that side of the PN junction which is associated with the emission of light. If there are a multiplicity of defects at the interface of the PN junction, the Umeda method is effective. However, in superior PN junctions produced by superior growth methods such as the liquid phase growth method using temperature difference technique, defects at the PN interface are reduced, and the Umeda technique is effective.

Kressel, in U.S. Pat. No. 3,537,029, proposes the employment of PP-junctions. It should be noted, however, the forbidden band width is different between the P type layer and the P-type layer. As noted above, a hetero-junction having different forbidden band widths gives rise to strain or dislocation due to the difference in the lattice constants at the boundary of the hetero-junction, and this constitutes the cause of non-radiation centers.

Rupprecht et al, in U.S. Pat. No. 3,600,240, proposes the employment of amphoteric silicon as an impurity for a PN junction. However, where a PN junction is formed with an amphoteric impurity, it is very difficult to control the carrier concentration. Accordingly, it is difficult to set the value of the impurity concentration at a required value. In general, owing to the intensive compensation, there is a tendency to become a pin junction.

Herzog, in U.S. Pat. No. 3,617,820, proposes to form a P+PN junction by diffusing Zn from the source $ZnAs_2$ into an N type GaAs, to produce dual diffusion profiles. However, where two layers are formed through one diffusion, it is difficult to control the carrier concentrations of the two layers independently of each other.

SUMMARY OF THE INVENTION

It is, therefore, an object of the present invention to provide a light-emitting semiconductor device for radiating incoherent light, which has a high light-emitting efficiency by the formation of a potential barrier for the minority carriers in at least one of the p type or n type semiconductor regions.

Another object of the present invention is to provide a light-emitting semiconductor device of the type described above, in which a lightly-doped inner semiconductor layer and a highly-doped outer (barrier) semiconductor layer, both having the same conductivity type and substantially the same forbidden band gap, are formed adjacent to each other and in such manner that the lightly-doped inner semiconductor layer is located adjacent the pn junction, thereby forming a potential barrier at the interface of the inner and outer layers for minority carriers injected across the pn junction.

Usually, charge carriers have a thermal energy of the order of kT, where k represents Boltzmann's constant and T represents absolute temperature in degrees Kelvin. A potential barrier having a height of about kT or greater than kT has the substantial effect of blocking the passage of charge carriers having such thermal energy. Those minority carriers which have been injected across the pn junction and which have arrived at the potential barrier are reflected thereat, and are provided further possibilities of radiative recombination. The light-emitting efficiency is thereby improved further.

Non-radiative recombination in a light-emitting diode decreases with a decrease in the number (concentration) of the non-radiative recombination centers, which are the dominant parameter for determining the quantum efficiency. Lower impurity concentration is advantageous to insure a lower concentration of the non-radiative recombination centers. Such decrease in the non-radiative recombination centers also serves to increase the carrier diffusion length. Where the radiative region has a small thickness as compared to the diffusion length, a considerable amount of the injected minority carriers will enter into the region rich in non-radiative recombination centers and will be non-radiatively recombined outside the radiative region. The carrier-reflecting potential barrier according to the present invention functions to reflect the minority carriers arriving thereat back into the radiative region, and hence is very effective to reduce the occurrence of the non-radiative recombinations without the need to increase the thickness of the radiative region and to this raise the light-emitting efficiency.

Relatively thin radiative region is also effective to reduce the absorption of emitting and propagating light in the radiative region.

DETAILED DESCRIPTION OF THE PREFERRED EMBODIMENTS

Figure 1:
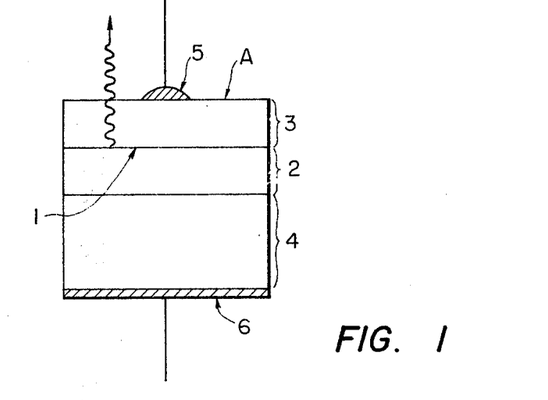
FIG. 1 is a schematic sectional view of a conventional light-emitting diode.
Figure 2A:
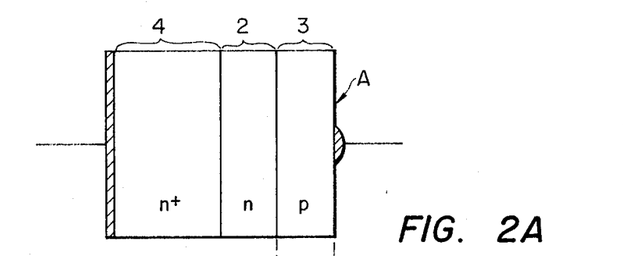
FIGS. 2A and 2B are a diagrammatic sectional view and a diagram for explaining the operation of the conventional light-emitting diode.
Figure 2B:
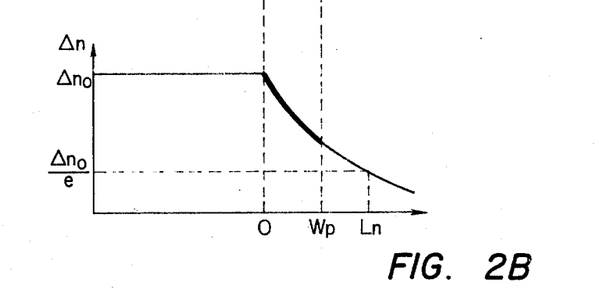

Light-emitting diodes have various structures. FIG. 1 illustrates a typical structure thereof. More particularly, a known light-emitting diode comprises a pn junction 1, a first semiconductor layer 2 of a first conductivity type, a second semiconductor layer 3 of a second conductivity type which is opposite to that of the first conductivity type, a semiconductor substrate 4 and electrodes 5 and 6. In the example of known light-emitting diode shown in FIG. 1, the light emitting in the radiative region is extracted mainly at a surface located opposite to the location of the semiconductor substrate 4 in a direction perpendicular to the pn junction 1. The electrode 5 on the light-outputting surface is only partially formed. The less recombination is present at non-radiative recombination centers, the higher is the light-emitting efficiency of a semiconductor light-emitting diode. Since the lifetime $\tau$ of minority carriers is mainly determined by the number of non-radiative recombination centers, the lifetime of minority carriers is longer in those light-emitting diodes having a higher light-emitting efficiency. As such, the diffusion length $L=\sqrt{D\tau}$ of minority carriers is markedly greater in light-emitting diodes of high efficiency. The surface of a semiconductor body, generally, is rich in non-radiative recombination centers. Also an electrode on a semiconductor body is a site where harsh non-radiative recombination takes place. For example, FIG. 2A shows a light-emitting diode comprising a semiconductor layer 2 of n type, a semiconductor layer 3 of p type, in which the p type region 3 serves as the main radiative region. The injection efficiency of electrons into this p type region 3 is rendered high by setting the donor concentration in the n type region 2 high. The excess electrons $\Delta n$ which are injected into the semiconductor layer 3 undergo a decay in the p type region 3 at a rate determined by the diffusion length L. Unless the thickness $W_p$ of the p type semiconductor layer 3 is sufficiently greater than the diffusion length $L_n$, a considerable amount of electrons will reach the surface A and will be recombined non-radiatively thereat. Accordingly, unless the condition $W_p>L_n$ is established, the light-emitting efficiency of a light-emitting diode will inevitably become markedly reduced.

Figure 3A:
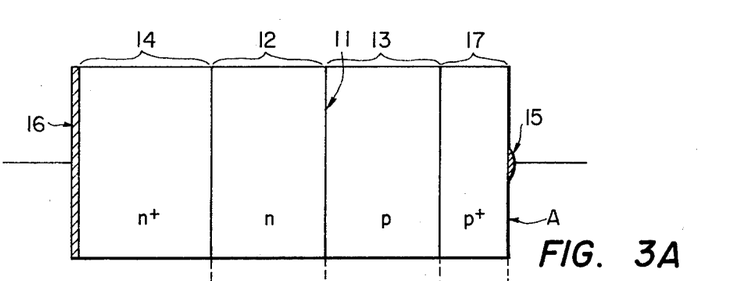
FIGS. 3A and 3B are a schematic sectional view and a band diagram for explaining a light-emitting diode according to an embodiment of the present invention.
Figure 3B:
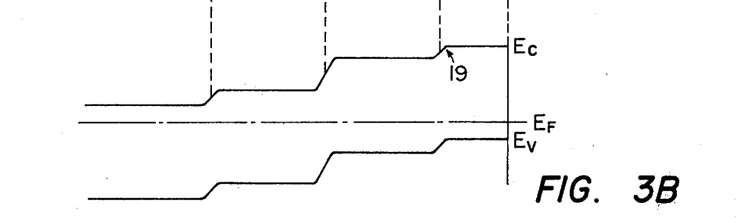

Next, description will be made of the light-emitting diode according to the present invention by referring to an embodiment shown in FIGS. 3A and 3B. The term "impurity or carrier concentration" hereinafter mentioned signifies "net impurity or carrier concentration" which is expressed by $|N_D-N_A|$, where $N_D$ and $N_A$ represent donor and acceptor concentrations, respectively. The light-emitting diode shown in FIG. 3A includes a pn junction 11, a first semiconductor layer 12 having a first conductivity type, a second semiconductor layer 13 of a second conductivity type, a substrate semiconductor body 14 of the first conductivity type, and electrodes 15 and 16, similar to the light-emitting diode of FIG. 1A. In this embodiment, a third semiconductor layer 17 having a conductivity type same as that of the second semiconductor layer 13 is formed on this second semiconductor layer 13 from which the emitted light is extracted. By setting the carrier concentration of this semiconductor layer 17 greater than that of the semiconductor layer 13, there is produced a potential barrier for minority carriers as illustrated at 19 in FIG. 3B. In FIGS. 3A and 3B, the first and second conductivity types are shown as n and p types, respectively. Here, symbol $E_V$ represents a valence band, $E_F$ Fermi-level, and $E_C$ a conduction band.

In some conventional cases also, a heavily-doped surface semiconductor layer was formed by such technique as diffusion technique in order to improve the ohmic contact between an electrode and a semiconductor body and to lower electric resistance. This, however, is intended to greatly increase the non-radiative recombination in this surface layer to thereby improve ohmic contact. For this reason, the carrier concentration of such a p+ type layer, for example, has been designed to have a value much greater than $10^{19}/cm^3$. Further, such increased carrier concentration is necessary only at the site where an electrode is formed, and such high concentration layer is not necessary and is undesirable for the surface A at which light is extracted. Generally, in III-V compound semiconductors such as GaAs, GaP, GaAlAs, GaPAs, InGaP and other compound semiconductors including quaternary or other mixed alloy systems such as GaAlAsP, a heavy diffusion of impurity at a level above the range of $1\times10^{19}$ cm$^{-3}$ to $2\times10^{19}$ cm$^{-3}$ results in a marked development of lattice defects.

By suppressing the degree of diffused impurity concentration to the range of $7\times10^{18}$ cm$^{-3}$ and $5\times10^{18}$ cm$^{-3}$ or therebelow, the generation of the number of non-radiative recombination centers due to the development of lattice defects in the vicinity of interface between the diffused and the matrix semiconductor layers can be suppressed considerably. For this reason, it is necessary to select the concentration of impurity or carriers at such a low level as will keep the occurrence of non-radiative recombination centers near the P+p (or N+n) interface from becoming conspicuous but that will establish a barrier of sufficient height to keep a large part of the minority carriers from thermally passing over the barrier. The thermal energy of carrier is of the order of kT. If entry of electrons from the p type region 13 into the p+ type region 17 is retarded and reduced to $1/e$ ($\approx 1/2.5$) in number by this barrier, the non-radiative recombination at the surface drops to about $1/e$. In other words, this has the effect of enhancing the light-emitting efficiency.

As is well known, energy distribution of carriers fundamentally follows Maxwell-Boltzmann distribution. Therefore, if the barrier has a height kT, carriers of about $(1-1/e)$ in number will be inhibited from diffusing through the barrier. Therefore, such barrier height is effective for enhancing the light-emitting efficiency. If the barrier height is above about 2 kT, almost all $(1-1/e^2)$ the carriers will be inhibited from their diffusion.

By denoting the height of barrier as $\Delta V$, it is related to the higher (region 17) and lower (region 13) impurity concentrations as:

$$q\Delta V=kTln(p^+/p),$$

If the higher impurity concentration p+ is above about e ($\approx 2.5$) times the lower impurity concentration p, the height of the barrier which is produced will become greater than about kT. Here, e denotes the value of the base of natural logarithm. Also, if the higher impurity concentration p+ is above about $e^2$ ($\approx 7.5$) times the lower impurity concentration p, the barrier height will become greater than about 2 kT. It will be apparent that similar potential barrier is formed by a n+n junction.

By providing a potential barrier at the boundary of the radiative region in a manner as described above, there can be obtained a light-emitting diode having a high light-emitting efficiency even where the thickness of the radiative semiconductor layer 13 is not greater than the diffusion length of the injected minority carriers.

For example, if the lower carrier concentration p of the second semiconductor layer 13 is $p=5\times10^{17}$ cm$^{-3}$, if the higher carrier concentration p+ of the third or surface semiconductor layer 17 is set at $1.25\times10^{18}$ cm$^{-3}$ or greater, there can be produced a potential barrier having a height greater than about kT. Also, if the carrier concentration of this third semiconductor layer 17 is $3.8\times10^{18}$ cm$^{-3}$ or greater, the barrier height will become greater than about 2 kT. It is needless to say that the barrier may have a height greater than 2 kT. If, however, the carrier concentration is above $5\times10^{18}$ cm$^{-3}$, there will be a marked development of lattice defects and hence non-radiative recombination centers, and therefore such a high concentration is not desirable.

The same consideration is applicable to the instance wherein the second semiconductor layer 13 (and third layer 17) is of the n type. In other words, there indeed exists a proper range of the higher carrier concentration for the n+ type the third semiconductor layer 17. In general, the above-said conditions concerning the potential barrier are same as for the p type layer. However, it should be understood that, in such III-V compound semiconductors as those enumerated above, a n type layer is more susceptible to generation of lattice defects at a low carrier concentration than the p type layer. At a carrier concentration of $5\times10^{18}$ to $7\times10^{18}$ cm$^{-3}$ or thereabove, the generation of lattice defects is especially conspicuous. However, by setting the carrier concentration of the n+ type layer to a level of $2\times10^{18}$ to $3\times10^{18}$ cm$^{-3}$ or lower, the development of lattice defects near the interface of semiconductor layers will not cause any significant problem. In any event, in order to prevent substantial loss of efficiency due to latice defects the impurity concentration of second semiconductor layer 13 should be maintained no more than $2 \times 10^{19}$ cm$^{-3}$ where region 13 is p type, and $7 \times 10^{18}$ cm$^{-3}$ when n type.

Figure 4A:
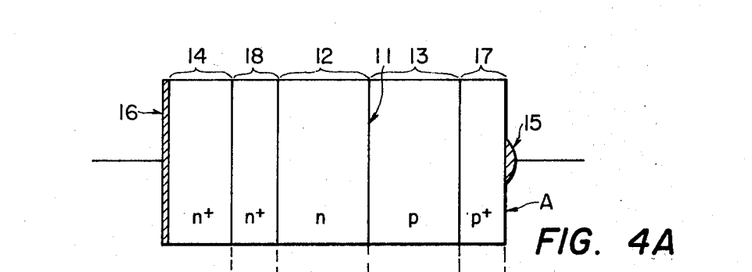
FIGS. 4A and 4B are a schematic sectional view and a band diagram for explaining a light-emitting diode according to another embodiment of the present invention.

A similar concept can also be applied to the side of the semiconductor substrate 14, especially when the pn junction is a homo junction. This will be explained hereunder by referring to FIGS. 4A and 4B. As illustrated in FIG. 4A, this light-emitting diode is of the arrangement that a fourth semiconductor layer 18 is formed on the substrate semiconductor body 14, and a first semiconductor layer 12, a second semiconductor layer 13 and a third semiconductor layer 17 are provided thereon in succession in this order. The fourth semiconductor layer 18 has a same conductivity type as the first semiconductor layer 12. By selecting the carrier concentration of this fourth semiconductor layer 18 greater than that of the first semiconductor layer 12, there is produced a potential barrier for minority carriers at the interface as shown at 20 in FIG. 4B. That side of the semiconductor layer from which light is extracted or the direction in which the light is extracted is identical with the instance shown in FIGS. 3A and 3B. It is also possible to extract the output light at the substrate side by forming a window in the substrate 14 and in the electrode 16.

A substrate compound semiconductor body, in general, has a poor crystallinity. Accordingly, although a potential barrier may be present even in the structure of FIG. 3A at the substrate-epitaxial layer interface, the non-radiative recombination in and near this substrate body is very extensive, so that it is almost impossible to expect a noticeable improvement of light-emitting efficiency by the use of a potential barrier at the interface between the substrate and the epitaxial layer. An intermediate layer 18 of a high carrier concentration as shown in FIG. 4A can greatly enhance the light-emitting efficiency of the light-emitting diode. There is, however, a consideration that an increase in the number of semiconductor layers will bring about a hike in the cost of manufacture, so that in case a considerable enhancement of luminous intensity can be expected without providing any other additional layer than the third semiconductor layer 17, or in case the substrate body has a sufficiently good crystallinity, the provision of the fourth semiconductor layer 18 may be omitted.

Also, where it is possible to form, with relative ease, a hetero structure having few lattice defects, as in Ga$_{1-x}$Al$_x$As alloy system, a similar enhanced light-emitting efficiency can be obtained by somewhat increasing the composition (mixing ratio) of Al of the fourth semiconductor layer 18 than that of the composition (mixing ratio) of Al of the first semiconductor layer 12, and thereby enlarging the band gap of this fourth semiconductor layer 14.

In forming the third semiconductor layer 17, use of the solution growth technique or the vapor growth technique is desirable because they do not impair crystallinity. However, since the cost of manufacture will increase with an increase in the number of semiconductor layers to be formed, as stated above, diffusion provides a simplified economical method. For example, diffusion is achieved at a relatively low temperature, from the surface of the second semiconductor layer 13 to obtain such carrier concentrations no more than $5 \times 10^{18}$ to $7 \times 10^{18}$ cm$^{-3}$. The fourth layer 18 may also be formed by diffusion from the substrate 14. Needless to say, both the first semiconductor layer 12 and the fourth semiconductor layer 18 and/or both the second semiconductor layer 13 and the third semiconductor layer 17 respectively have substantially the same semiconductor composition and substantially the same band gap, unless specified otherwise.

A hetero interface, in general, contains a number of lattice defects. This is why the formation of a potential barrier by virtue of carrier concentration is significant. However, even if the adjacent semiconductor layers are of a same composition, i.e. when, for example, the first semiconductor layer 12 is formed with Ga$_{1-x}$Al$_x$As and the second semiconductor layer 13 is formed with Ga$_{1-x'}$Al$_{x'}$As with a condition $x \approx x'$, a difference between the lattice constants of these two layers may be developed due to the difference in their carrier concentrations. Therefore, in order to compensate for such difference, it is effective to resort to such technique as to make either one or both of these two layers a quaternary system by an inclusion of a small amount of phosphorus P. In such instance, if no noticeable change in the width of the forbidden band is caused by the addition of phosphorus, these two semiconductor layers may be regarded as having substantially the same composition. More concrete embodiments will be explained hereinbelow.

EXAMPLE 1

A green color GaP light-emitting diode as shown in FIGS. 3A and 3B is manufactured by relying on the "successive solution growth by the temperature difference" technique (U.S. Ser. No. 587,137, now progressed to CIP Application Ser. No. 871,113: corresponding to Japanese Pat. No. 857,545, Publication No. Sho 51-32532) based on the "crystal growth under controlled vapor pressure" technique (Japanese Patent Application No. Sho 49-20916: Laying-open preliminary Patent Publication No. Sho 50-114386; Japanese Patent Application No. Sho 48-11461: Laying-open preliminary Patent Publication No. Sho 49-99,268; Japanese Patent Application No. Sho 48-19048: Laying-open preliminary Patent Publication No. Sho 49-106,481). The light-emitting diode as manufactured above is found to have a high efficiency, with very few lattice defects. In this instance, further, no nitrogen N is doped in the radiative region, unlike conventional yellowish green color GaP light-emitting diodes. Therefore, this light-emitting diode has a desirable crystallinity, and the lifetime of minority carriers is noted to be several 100 nsec or greater. The diffusion length of minority carriers surpasses 50 micrometers. If, as according to the conventional concept, the radiative layer is required to have a thickness greater than the diffusion length, the radiative layer will have to have a thickness greater than 50 micrometers. A thickness of the radiative layer around 50 micrometers may provide a good light-emitting efficiency. However, industrial convention and economics dictate that an epitaxial layer or a radiative layer have a thickness ranging from 10 to 20 micrometers. If the thickness of an epitaxial layer is excessively great, it will naturally require a long period of time for growth. For example, where an epitaxial layer or a radiative layer is grown by arranging a slider below a melt, placing a semiconductor substrate on this slider and bringing it to be in contact with the melt, the formation of an epitaxial layer requiring a lengthy period of time tends to cause a bulging in the surface of the layer above the slider surface. When the slider carrying the epitaxial layer formed thereon is moved, the bulging surface of the layer may be caught by the bottom wall surface of the crucible, causing injury to the surface of the layer, or stopping the slider itself in its travel. In this example, according to the known method, an n type first layer 12 having carrier concentration of $n=5\times 10^{17}$ cm$^{-3}$ is grown on top of an n$^+$ type semiconductor substrate crystal 14 ($n=5\times 10^{18}$ cm$^{-3}$). Thereafter, the slider is moved to a site just below a second melt to grow a p type second layer 13 ($p=8\times 10^{17}$ cm$^{-3}$) to a thickness of about 10 micrometers.

The resulting substrate is then moved to a third melt location, and a third layer 17 of a carrier concentration ($p=3\times 10^{18}$ cm$^{-3}$) is grown. This third layer 17 may have a thickness of 1 micrometer or smaller.

Figure 4B:
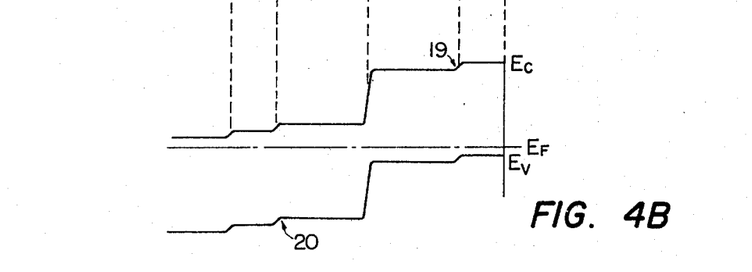

A fourth GaP layer as described in connection with FIGS. 4A and 4B may also be provided.

EXAMPLE 2

Figure 5:
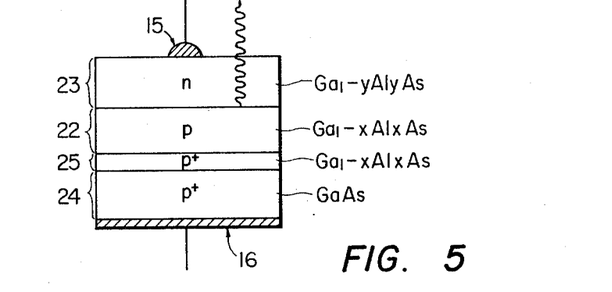
FIG. 5 is a schematic sectional view of a light-emitting diode according to further embodiment of the present invention.

As illustrated in FIG. 5, by relying on the "solution growth by the temperature difference" method, a fourth p type Ga$_{1-x}$Al$_x$As layer 25 ($x=0.32$ and $p=3\times 10^{18}$ cm$^{-3}$) is grown on a p$^+$ type GaAs substrate 24 (p$^+$ = $1\times 10^{19}$ cm$^{-3}$). Thereafter, a first p type Ga$_{1-x}$Al$_x$As layer 22 ($p=1\times 10^{18}$ cm$^{-3}$), and a second n type Ga$_{1-y}$Al$_y$As layer 23 ($x<y$) are grown thereon in succession. In this instance, the radiative layer is constituted by the p type first layer 22 having a forbidden band gap narrower than the n type second layer. The p$^+$p junction between layers 25 and 22 establishes a potential barrier for electrons in the p type layer 22. Since the diffusion of positive holes into the n type layer 23 is scarce because of the built-in barrier formed at the hetero pn junction, there is no need to form a third layer for the production of a potential barrier. By preparing the fourth layer 25 with a same composition as that of the first layer 22, the development of lattice defects due to lattice mismatch can also be reduced effectively.

Figure 6A:
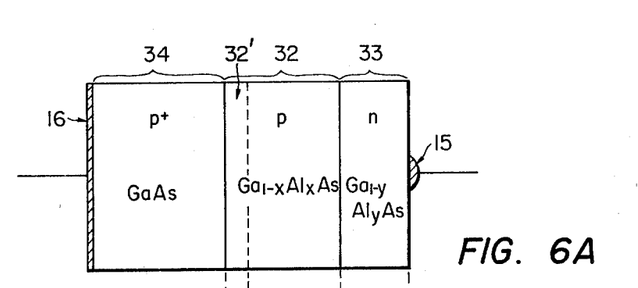
FIGS. 6A and 6B are a schematic sectional view and a band diagram illustrating a light-emitting diode according to another embodiment of the present invention.
Figure 6B:
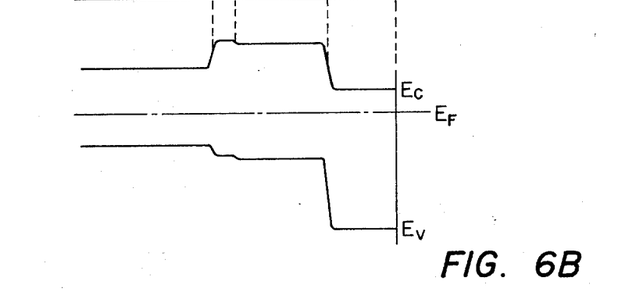

On the other hand, from the viewpoint of the demand to manufacture light-emitting diodes at as low a cost as possible, the formation of a smaller number of semiconductor layers is desirable. Description will next be directed to such instance by referring to FIGS. 6A and 6B. As shown in FIG. 6A, on top of a p$^+$ type GaAs substrate 34, there is formed a p type Ga$_{1-x}$Al$_x$As first layer 32, and on this first layer is formed an n type Ga$_{1-y}$Al$_y$As second layer 33. By setting $y>x$, the forbidden band gap of the n type layer is greater than that of the p type layer, so that the diffusion of positive holes is blocked by the built-in potential barrier produced at the hetero pn junction. Therefore, there is no need to form a third layer for the development of a potential barrier. Those electrons which are injected from the pn hetero junction into the p type layer participate, in this p type layer, in the emission of light. The emitting light passes across the pn hetero junction and through the n type layer having a large band gap, and is extracted on that side of the layer located opposite to the substrate, with no absorption loss. As is well known, in GaAs and Ga$_{1-x}$Al$_x$As, the p type crystal has much fewer lattice defects which constitute non-radiative recombination centers as compared with the n type crystal. Therefore, the p type layer is used to serve as a radiative layer, since it is difficult to use the n type layer as a main radiative layer. If the carrier concentration p of the p type Ga$_{1-x}$Al$_x$As radiative region 32 is excessively great, an increase in the number of lattice defects will result. Therefore, in order to maximize the light-emitting efficiency, it is necessary to suppress the carrier concentration of the p type first layer 32, $P_1$ to such level as is expressed by:

$$4.5\times 10^{17} \text{ cm}^{-3} < P_1 < 2.5\times 10^{18} \text{ cm}^{-3}.$$

The most desirable condition is:

$$9\times 10^{17} \text{ cm}^{-3} < P_1 < 2\times 10^{18} \text{ cm}^{-3}.$$

Considering the above-mentioned condition, zinc is used as the impurity for the p$^+$ type GaAs substrate 34, and the carrier concentration p$^+$ is set to be considerably greater than the carrier concentration $P_1$ of the first layer 32. Since zinc diffuses relatively quickly, it diffuses into the first layer 32 during its growth. Thus, there is formed a fourth layer 32a which functions practically as a potential barrier. Since the carrier concentration $P_1^+$ of this fourth layer 32a is usually at a level lower than that of the substrate, the carrier concentration of the substrate should be selected to produce a sufficiently high carrier concentration $P_1^+$ of the fourth layer 32a to satisfy:

$P_1^+ > e \cdot P_1$, where e represents the base of natural logarithm. Usually, the carrier concentration $P_1$ of the first layer 32 is selected so that, for example, $P_1 < 2\times 10^{18}$ cm$^{-3}$. Therefore, the carrier concentration p$^+$ of the substrate 34 desirably is set to be at least equal to $5\times 10^{18}$ cm$^{-3}$, and desirably is selected further higher in case $P_1$ is great. However, by selecting the carrier concentration of the substrate 34 to be in the order of $10^{19}$ cm$^{-3}$, there should be no problem even if the carrier concentration of the diffusion layer is somewhat lower than the carrier concentration of the semiconductor substrate. Needless to say, if the carrier concentration of the semiconductor substrate is set at an excessively large value, this will give rise to an increase in the number of lattice defects. On the other hand, however, if the carrier concentration of the semiconductor substrate is lowered excessively, an increase in the series resistance will be caused. The thickness of the semiconductor substrate of a light-emitting diode usually is greater by more than one order of magnitude than that of an epitaxial layer or a diffusion layer. Accordingly, the employment of a semiconductor substrate having a high carrier concentration is effective for the reduction of series resistance even with a sacrifice represented by some increase in the number of lattice defects.

It should be noted here that, in such instance as stated above, a progressive variance in the composition x of mixed crystal semiconductor Ga$_{1-x}$-Al$_x$As in the first layer 32 as the portions of this composition depart farther away from the location of the pn junction, will bring about a substantial reduction of the width of forbidden band, attributable to such variance, to an extent greater than the height of the potential barrier which is produced by the difference in the carrier concentrations of the neighboring two layers. In such a case, the significance of providing a difference in carrier concentrations will be lost.

The first layer 32 is formed with a thickness much greater than that of such a device as a semiconductor laser. Therefore, if this radiative layer is formed by relying on the usual gradual cooling growth technique, it becomes difficult to reduce the variation of the mixing ratio x of the composition, $\Delta x$ to a value 0.02 or lower. However, by relying on the "successive solution growth by the temperature difference" method proposed by the author and disclosed in said U.S. Ser. No. 587,137 (presently CIP Application Ser. No. 871,113) which does not include any temperature-lowering process during the growth step, it is possible to maintain the composition of the epitaxial layer constant irrespective of the thickness of this layer, and thus it is easy to restrict the amount of variation of the aluminum concentration x, $\Delta x$, to a value: $\Delta x < 0.01$. When measured by considering the variance of the wavelengths of emitting lights generated by light-emitting diodes produced from the same semiconductor wafer, the amount of variation of the aluminum concentration, i.e. $\Delta x$, is noted to be as small as $\Delta x < 0.002$. It should be understood here that this value is based on those portions of the epitaxial layer excluding the portion located in the vicinity of the interface between adjacent layers at which mutual atomic diffusions take place.

Figure 7A:
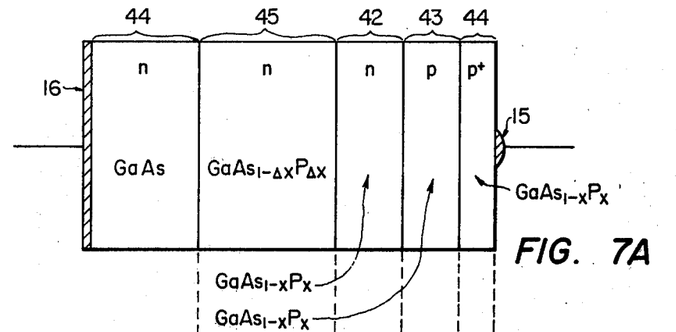
FIGS. 7A and 7B are a schematic sectional view and a band diagram of a light-emitting diode according to still another embodiment of the present invention.
Figure 7B:
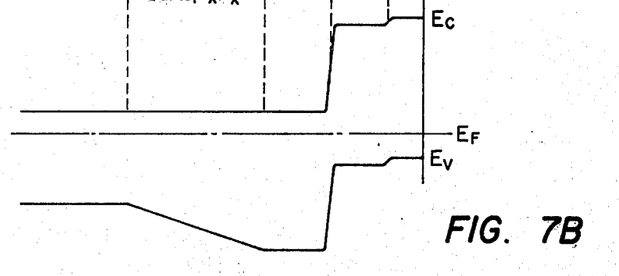

Next, description will be made of an example wherein the epitaxial growth layer is comprised of $GaP_{1-x}As_x$ by referring to FIGS. 7A and 7B.

EXAMPLE 3

In case of a light-emitting diode using the mixed crystal $GaP_{1-x}As_x$, a large lattice mismatch arises between the GaAs semiconductor substrate and the $GaP_{1-x}As_x$ epitaxial layer. Therefore, it is necessary to arrange a intervening layer to have a large thickness to reduce the effect of lattice mismatch. For this reason, it is desirable to form this intervening layer by epitaxial growth technique rather than by relying on impurity diffusion.

For example, by relying on the vapor growth technique, an intervening layer 45 which is comprised of an n type $GaAs_{1-\Delta x}P_{\Delta x}$ is formed on top of an n type GaAs substrate 44. Here, $\Delta x$ indicates gradual variation of the composition x. Further, on this intervening layer 45 is grown an n type $GaAs_{1-x}P_x$ layer 42. The composition x is made constant in the n type layer 42. The intervening layer 45 is provided to prevent abrupt change of the lattice constant. The lattice constant is arranged so that it undergoes successive variation as the location goes away from the GaAs substrate 44, through the intervening layer 45, into the layer 42, and that its final value $\Delta x = x$ is set to $0.3 \leq x \leq 0.35$. Next, Zn is thermally diffused from the surface of the n type $GaAs_{1-x}P_x$ layer 42, and thus a p type $GaAs_{1-x}P_x$ layer 43 is obtained. In such instance, the temperature of the diffusion source is controlled to secure the diffusion depth of not greater than about 2 micrometers and the carrier concentration of not higher than about $1 \times 10^{18} cm^{-3}$. Following this, the temperature of the diffusion source is elevated and the diffusion is continued, thereby obtaining a p+ type $GaAs_{1-x}P_x$ surface layer 44 of about 0.2 micrometer in thickness. It is needless to say that the p type $GaAs_{1-x}P_x$ layer 43 and the p+ type $GaAs_{1-x}P_x$ surface layer 44 may be formed by relying on vapor epitaxial growth technique or by solution growth technique.

As stated and illustrated above, the technique of the present invention of forming a potential barrier, by utilizing the difference in impurity concentrations, at the interface between semiconductor layers having same conductivity type and same forbidden band gap is greatly effective to enhance the light-emitting efficiency of a light-emitting diode. Also, the effective thickness of the radiative layer can be made much smaller than that of light-emitting diodes designed in accordance with conventional concepts, so that the economic advantage of the present invention is prominent.

It will be apparent that the present invention is not limited to the examples described and illustrated above. For example, material for forming the light-emitting diode, direction of extracting output light, inner structure of the light emitting diode, and so forth can be changed or modified widely within the scope of the present invention.

What is claimed is:

1. A light-emitting semiconductor device for radiating incoherent light, comprising:
    a semiconductor substrate;
    a first semiconductor layer disposed on said substrate and having a first conductivity type and a first net impurity concentration;
    a second semiconductor layer disposed on said first semiconductor layer to act as a dominant luminescent layer and having a second conductivity type opposite to said first conductivity type and a second net impurity concentration and forming a pn junction with said first semiconductor layer, said second conductivity type being constituted by shallow impurities which are atoms different from those in the first semiconductor layer; and
    a third semiconductor layer disposed on said second semiconductor layer and having said conductivity type and a third net impurity concentration and substantially a same composition as that of the second semiconductor layer,
    said third net impurity concentration being at least about e times said second net impurity concentration where e is the value of the base of natural logarithms for forming an effective potential barrier for minority carriers in said second semiconductor layer,
    the third net impurity concentration being about $2 \times 10^{19} cm^{-3}$ as substantially an upper limit value not inducing many defects at the interface of said second and third semiconductor layers when the second conductivity type is p type and about $7 \times 10^{18} cm^{-3}$ as substantially an upper limit value not inducing many defects at the interface of said second and third semiconductor layers when the second conductivity is n type.

2. A light-emitting semiconductor device according to claim 1, wherein:
    said third net impurity concentration is at least about $e^2$ times said second net impurity concentration.

3. A light-emitting semiconductor device according to claim 1, wherein:
    said third net impurity concentration is about $5 \times 10^{18} cm^{-3}$ at most when said second conductivity type is p type and is about $3 \times 10^{18} cm^{-3}$ at most when said second conductivity type is n type.

4. A light-emitting semiconductor device according to claim 1, further comprising:
    an electrode formed with a low-resistivity material disposed only on part of said third semiconductor layer.

5. A light-emitting semiconductor device according to claim 1, further comprising:
    a fourth semiconductor layer of said first conductivity type disposed between said substrate and said first semiconductor layer having a fourth net impurity concentration and a substantially same forbidden band gap with said first semiconductor layer,
    the fourth net impurity concentration being at least about e times the first net impurity concentration and being about $2 \times 10^{19} cm^{-3}$ at most when said first conductivity type is p type and about $7 \times 10^{18} \text{cm}^{-3}$ at most when said first conductivity is n type.

6. A light-emitting semiconductor device according to claim 5, wherein:
said first, second, third and fourth semiconductor layers have a substantially same band gap.

7. A light-emitting semiconductor device according to claim 5 or 6, wherein:
said fourth net impurity concentration is at least about $e^2$ of said first net impurity concentration.

8. A light-emitting semiconductor device according to claim 5 or 6, wherein:
said fourth net impurity concentration is about $5 \times 10^{18} \text{cm}^{-3}$ at most when said first conductivity type is p type and about $3 \times 10^{18} \text{cm}^{-3}$ at most when said first conductivity is n type.

9. A light-emitting semiconductor device according to claim 1, further comprising:
a fourth semiconductor layer of said first conductivity type disposed between said substrate and said first semiconductor layer and formed with a material having a wider band gap than that of the first semiconductor layer.

10. A light-emitting semiconductor device according to claim 1, wherein:
said first, second and third semiconductor layers are formed with $GaP_{1-x}As_x$.

11. A light-emitting semiconductor device according to claim 10, wherein:
fluctuation of said x, $\Delta x$, is less than 0.01, $\Delta x < 0.01$.

12. A light-emitting semiconductor device according to claim 5, wherein:
said first and fourth semiconductor layers include a small but different amount of an additional element for compensating for lattice mismatch attributable to different impurity concentrations.

13. A light-emitting semiconductor device for radiating incoherent light, comprising:
a p type substrate having a high net impurity concentration of at least $1 \times 10^{19} \text{cm}^{-3}$;
a first semiconductor layer of a first semiconductor material and of p type and disposed on said p type substrate;
a second semiconductor layer of a second semiconductor material and of n type and disposed directly on said first semiconductor layer to form a pn junction therewith,
said second semiconductor material having a wider forbidden band gap than said first semiconductor material,
said first semiconductor layer having a net impurity concentration, in the neighborhood of said pn junction, of about $2.5 \times 10^{18} \text{cm}^{-3}$ at most.

14. A light-emitting semiconductor device according to claim 13, wherein:
said high net impurity concentration of the p type substrate is given mainly by zinc.

15. A light-emitting semiconductor device according to claim 13, wherein:
said substrate is formed with gallium arsenide and said first and second semiconductor layers are formed mainly with gallium-alluminum arsenide.

16. A light-emitting semiconductor device according to claim 15, wherein:
said first semiconductor layer is formed with $Ga_{1-x}Al_xAs$ and the fluctuation of said x, $\Delta x$, is less than 0.01, $\Delta x < 0.01$.

17. A light-emitting semiconductor device according to claim 15, wherein:
said net impurity concentration of the first semiconductor layer is between $4.5 \times 10^{17} \text{cm}^{-3}$ and $2.5 \times 10^{18} \text{cm}^{-3}$.

18. A light-emitting semiconductor device according to claim 17, wherein:
said net impurity concentration of the first semiconductor layer is between $9 \times 10^{17} \text{cm}^{-3}$ and $2 \times 10^{18} \text{cm}^{-3}$.

19. A light-emitting III-V semiconductor device for radiating incoherent light, comprising:
a first III-V semiconductor layer of a first conductivity type having a first net impurity concentration;
a second III-V semiconductor layer of a second conductivity type opposite to said first conductivity type and disposed in contact with said first III-V semiconductor layer to form a pn junction and having a surface located opposite to and substantially parallel with said pn junction, the second III-V semiconductor layer having a second net impurity concentration; and
a surface III-V semiconductor layer of said second conductivity type disposed on said surface of said second III-V semiconductor layer and having a light-extracting surface located opposite to said surface of said second III-V semiconductor layer,
The surface layer being formed with a substantially same material as said second III-V semiconductor layer and having a surface net impurity concentration of at least about e times the second net impurity concentration, where e is the value of the base of natural logarithms and is no more than approximately $2 \times 10^{19} \text{cm}^{-3}$ where said second conductivity type is p type, and less than approximately $7 \times 10^{18} \text{cm}^{-3}$ where said second conductivity type is n type.

20. A light-emitting III-V semiconductor device according to claim 16, wherein:
said second semiconductor layer is formed with a compound mixed crystal and the fluctuation of composition of said mixed crystal is less than 0.01.

21. A light-emitting III-V semiconductor device according to claim 19 or 20, wherein:
said surface net impurity concentration is at least about $e^2$ times the second net impurity concentration, and said first net impurity concentration is higher than said second net impurity concentration.

22. A light-emitting semiconductor device for radiating incoherent light, comprising:
a semiconductor substrate;
a first semiconductor layer disposed on said substrate and having a first conductivity type and a first net impurity concentration;
means for emitting light in response to radiation recombinations of charge carriers therein, including a second semiconductor layer disposed on said first semiconductor layer and having a second conductivity type opposite to said first conductivity type and a second net impurity concentration and forming a pn junction with said first semiconductor layer; and
means for generating a potential barrier to minority charge carriers in said second semiconductor layer without generating a substantial number of nonradiative recombination cites, comprising a third semiconductor layer disposed on said second semiconductor layer and having said second conductivity type and a third net impurity concentration and substantially a same composition as that of the second semiconductor layer,
said third net impurity concentration being equal to no more than $2 \times 10^{19} \text{cm}^{-3}$ in respect of a p second conductivity type and no more than $7 \times 10^{18} \text{cm}^{-3}$ in respect of a n second conductivity type, and in each instance equal to at least about e times said second net impurity concentration where e is the value of the base of natural logarithms.

* * * * *